United States Patent [19]

Sato

[11] Patent Number: 5,736,463
[45] Date of Patent: Apr. 7, 1998

[54] METHOD AND APPARATUS FOR CHEMICAL/MECHANICAL POLISHING

[75] Inventor: Junichi Sato, Tokyo, Japan

[73] Assignee: Sony Corporation, Japan

[21] Appl. No.: 650,309

[22] Filed: May 20, 1996

[30] Foreign Application Priority Data

May 30, 1995 [JP] Japan ................... 7-155226

[51] Int. Cl.⁶ .................. B24D 17/00; H01L 21/00
[52] U.S. Cl. .................. 438/692; 156/345; 451/287; 451/532; 216/88; 216/89
[58] Field of Search ................ 156/636.1, 345; 216/88, 89; 451/287, 532

[56] References Cited

U.S. PATENT DOCUMENTS

| | | | |
|---|---|---|---|
| 4,728,552 | 3/1988 | Jensen, Jr. ................... | 451/527 X |
| 5,154,021 | 10/1992 | Bombardier et al. ........... | 51/262 A |
| 5,287,663 | 2/1994 | Pierce et al. ................ | 51/401 |
| 5,456,736 | 10/1995 | Waki et al. ................... | 216/88 X |

Primary Examiner—Thi Dang
Attorney, Agent, or Firm—Ronald P. Kananen

[57] ABSTRACT

A method and apparatus for chemical/mechanical polishing in which an object to be polished, such as a wafer, is polished by pressing a polishing pad on the object and rotating the polishing pad relative to the object while supplying a slurry to the object, wherein the polishing pad contains a shape memory material. This is effective to easily repair the polishing pad for a short period of time, and hence to increase the productivity in manufacture of ICs or the like.

18 Claims, 5 Drawing Sheets

F I G. 3A
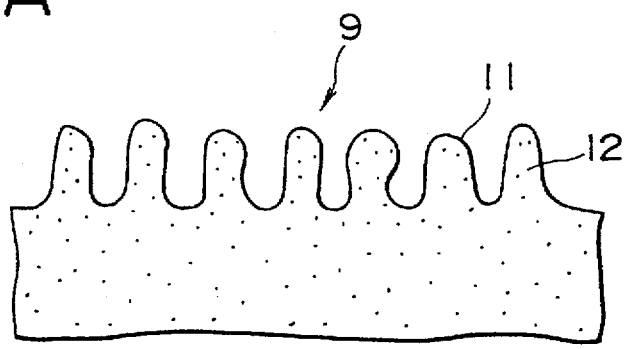
F I G. 3B
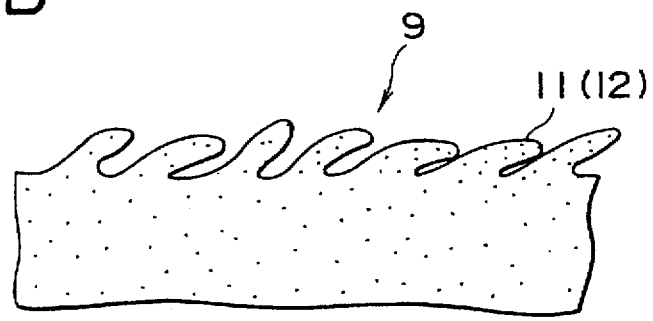
F I G. 3C
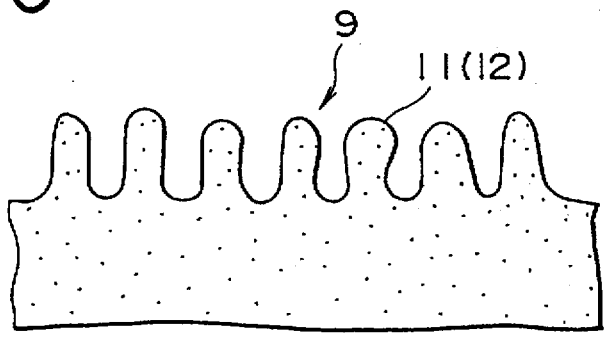

BEFORE POLISHING

AFTER POLISHING

BEFORE POLISHING

AFTER POLISHING

METHOD AND APPARATUS FOR CHEMICAL/MECHANICAL POLISHING

BACKGROUND OF THE INVENTION

The present invention relates to a method and an apparatus for chemical/mechanical polishing used for processes for manufacturing semiconductor devices, and particularly to an improved method and apparatus for forming multilayer interconnections. For example, the method and apparatus for chemical/mechanical polishing according to the present invention is applicable for planarizing interlayer insulating films or forming metal plugs at a high reliability in a process for forming multilayer interconnections in the manufacture of semiconductor integrated circuits highly integrated at highly finer-line geometries, such as a memory element or logic arithmetic element.

The tendency to finer-line geometries and multiple layers of interconnections has enhanced with the thrust toward high density of semiconductor devices, and a so-called multilayer interconnecting technique has come to take an important role in a process of manufacturing semiconductor integrated circuits. On the other hand, a problem has been encountered in forming multilayer interconnections.

The problem is that finer-line geometries and multiple layers of interconnections tend to make larger and steeper a difference in steps of an interlayer insulating film. This causes an inconvenience in reducing the processing accuracy and reliability of an interconnection formed on such an interlayer insulating film. To cope with the inconvenience, there has been a strong demand toward improvement in planarization of an interlayer insulating film for the reason that the step coverage of an Al interconnection cannot be expected to be significantly improved.

Incidentally, a wavelength of a beam used for lithography tends to be shortened for increasing resolution; however, in this case, depth of focus is reduced. Even from such a viewpoint of a reduction in depth of focus, the improvement in planarization of an interlayer insulating film becomes important. In other words, the resolution in lithography, which is already attained to a limitation, must be kept by improvement in planarization of an interlayer insulating film.

Although there have been developed various methods of forming insulating layers and planarizing insulating films, they have presented an important problem when applied to multilayer interconnections with finer-line geometries, that is, a connection failure between interconnections due to shortage of planarization generated in the case of a wide interval between interconnections or due to generation of a so-called "sparse state" of an interlayer film in an interval between interconnections.

To solve the above-described problem, a global planarization method for planarizing the entire surface of an interlayer insulating film using a related art chemical/mechanical polishing (CMP) having been adopted for mirror-like polishing for a silicon wafer, has been examined and come to be partially put in practice.

This method, which is expected to perfectly planarize the entire surface of an interlayer insulating film, is carried out as follows. A wafer to be polished is fixedly held on a carrier by a vacuum or mechanical chucking in such a state that the wafer faces a polishing plate or platen. A slurry in which polishing particles are suspended is then supplied from a slurry source to a polishing cloth or polishing pad attached on the polishing plate through a slurry inlet. The polishing is made in such a state by adjusting rotational speeds of the polishing plate and the carrier, and the polishing pressure. At this time, the polishing is desirable to be made in a basic atmosphere containing KOH for etching an insulating film. The slurry is sufficiently removed after chemical/mechanical polishing, to complete the planarization.

The related art CMP method, however, presents some problems. One is a so-called "fatigue phenomenon" of a polishing pad, which occurs after an elapse of a specified time since the polishing pad is used. The "fatigue phenomenon" of a polishing pad will be briefly described below. A polishing pad is formed of a napped cloth in which the polishing surface has a plurality of polishing fibers planted upright therefrom. A slurry containing polishing particles permeates between the polishing fibers, and is used for surface polishing of an object to be polished (for example, semiconductor wafer). The polishing pad, however, has a disadvantage. As the polishing proceeds, the napped pad come to be fatigued, that is, the polishing fibers planted upright from the surface of the pad are fallen, to thereby lose the elastic force. The polishing fibers in such a fatigue state cannot hold the slurry, as a result of which the polishing rate is lowered. For this reason, after completion of polishing several wafers, the polishing pad must be subjected to a resetting work called "pad conditioning". Such a resetting work, however, reduces the efficiency of polishing, leading to a reduction in throughput. Namely, while the throughput of the chemical/mechanical polishing is originally low, it is further lowered by the above pad conditioning, to thus further reduce the productivity.

OBJECT AND SUMMARY OF THE INVENTION

An object of the present invention is to provide a method and an apparatus for chemical/mechanical polishing capable of effectively napping a polishing pad without harming the performance of the chemical/mechanical polishing due to the polishing pad.

To achieve the above object, according to a first aspect of the present invention, there is provided a method for chemical/mechanical polishing including the steps of: supplying a slurry to an object to be polished; and pressing a polishing pad on the object, and rotating the polishing pad relative to the object; wherein the polishing pad contains a shape memory material.

According to a second aspect of the present invention, there is provided an apparatus for chemical/mechanical polishing including: a polishing pad pressed to an object to be polished and rotated relative to the object for polishing the object; and a slurry supplied to the object when the object is polished by the polishing pad; wherein the polishing pad contains a shape memory material.

The above shape memory material is preferably a shape memory alloy.

A polishing pad includes polishing fibers, each having a core made of a shape memory material. Each core of the shape memory material is set to be upright from the surface of the polishing pad, to form a standard state that the polishing pad is napped. After an elapse of a specified time since the polishing was started, the elastic force of each polishing fiber is weakened and fallen due to the above-described fatigue phenomenon of the polishing pad. At this time, the polishing is interrupted and the polishing pad is returned to the original environmental condition, that is, the fabricating condition of the polishing pad. This allows the shape memory material to be returned to the upright state, and to recover the napped state of the polishing pad.

BRIEF DESCRIPTION OF THE DRAWINGS

FIGS. 3A to 3C are schematic views showing the configuration and function of a second embodiment concerning a polishing pad of the apparatus for chemical/mechanical polishing;

DETAILED DESCRIPTION OF THE PREFERRED EMBODIMENTS

Hereinafter, embodiments of the present invention will be described with reference to the drawings.

Figure 1:
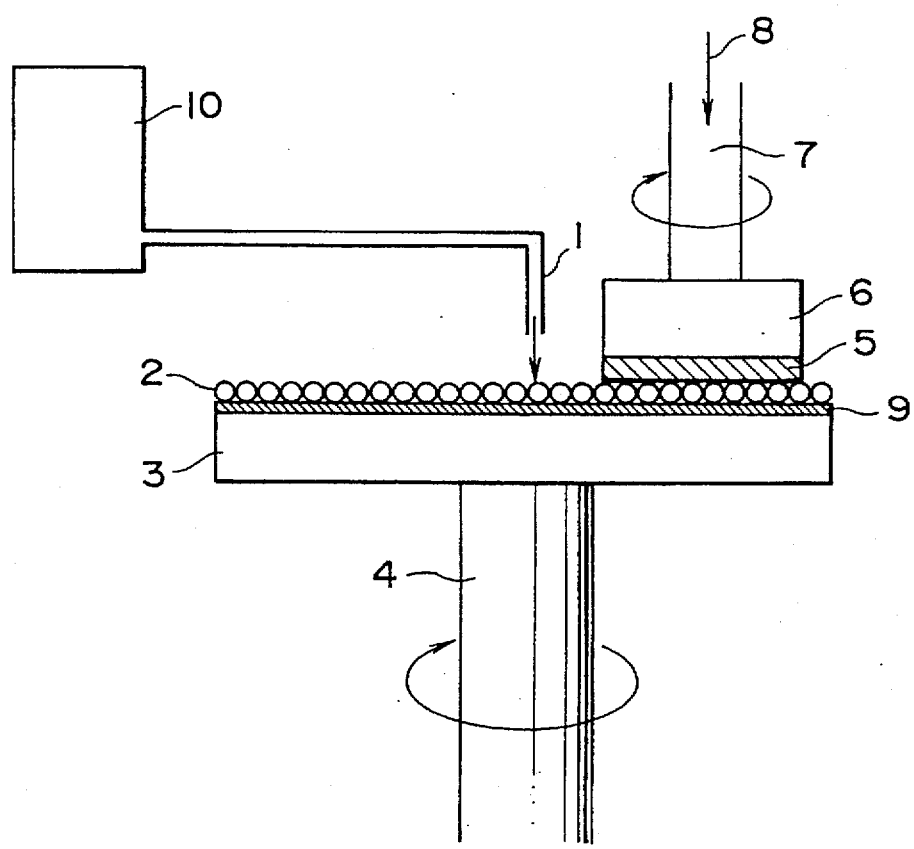
FIG. 1 is a schematic view showing the entire configuration of an apparatus for chemical/mechanical polishing used for carrying out the present invention.

Prior to the description of the actual polishing process, an apparatus for chemical/mechanical polishing used for carrying out the present invention will be described with reference to FIG. 1. FIG. 1 is a schematic view of the apparatus for chemical/mechanical polishing. A carrier 6 holding a wafer 5 is set to a polishing plate or a platen 3 in such a manner that the wafer 5 faces the polishing plate 3. The wafer 5 is held by the carrier 6 by a chucking means (not shown). A slurry 2 stored in a slurry source 10 is then supplied through a slurry inlet 1 onto a polishing cloth (polishing pad) 9 attached on the polishing plate 3. The polishing is performed in such a state by adjusting the rotational speeds of the carrier 6 and a rotational shaft 4 of the polishing plate 3, and a pressure 8 applied to the carrier 6 by a polishing pressure controller (not shown).

It is to be noted that the mounting manner of the wafer, the configuration and the number of the platen and carrier, and the kind of the slurry are not particularly limited.

Figure 2A:
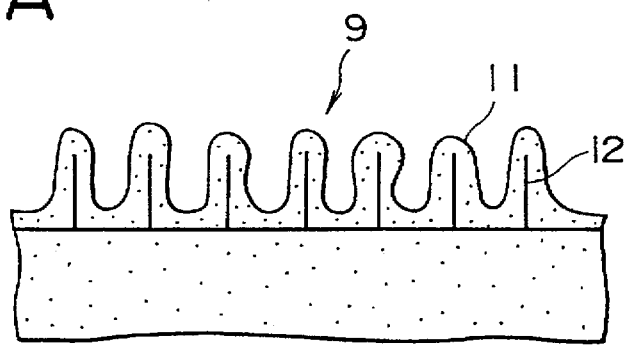
FIGS. 2A to 2C are schematic views showing the configuration and function of a first embodiment concerning a polishing pad of the apparatus for chemical/mechanical polishing.
Figure 2B:
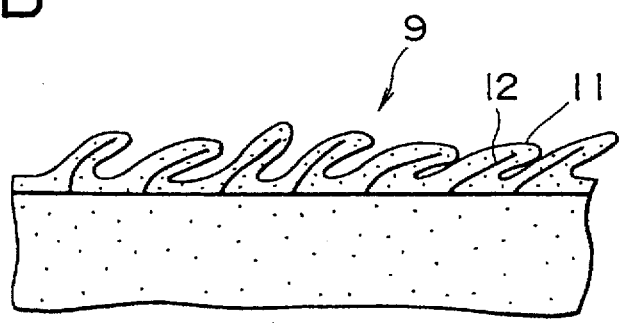
Figure 2C:
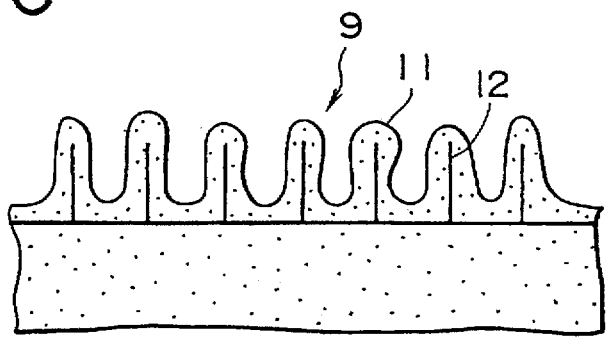

FIGS. 2A to 2C are schematic views illustrating the configuration and function of a first embodiment of the present invention, which concerns the polishing pad 9. The polishing surface side of the polishing pad 9 is formed of a plurality of upright polishing fibers 11. The core of each polishing fiber 11 is made of a shape memory alloy filament 12. The shape memory alloy filament 12 of the polishing fiber 11 is coated with a suitable resin.

The shape memory alloy filaments 12 are in the upright state as shown in FIG. 2A before being used for polishing. In other words, the polishing fibers 11 are napped before being used for polishing. In addition, the diameter of the shape memory alloy filament 12 is in a range of 1.0 μm or less.

After an elapse of a specified time since the polishing pad 9 was used for polishing, the polishing fibers 11 come to be fallen as shown in FIG. 2B by a pressure applied during polishing, that is, they come to be in the so-called "fatigue state". Each shape memory alloy filament 12 (diameter: 1.0 μm or less) as the core of the polishing fiber 11 is also fallen.

At this time, the polishing pad is interrupted, and the polishing pad 9 is returned to an original environmental condition, that is, the condition before polishing, as a result of which each shape memory alloy filament 12 is returned to the original upright state as shown in FIG. 2C. The polishing fibers 11 are thus returned to the upright state. In addition, the polishing pad 9 is made of, for example, polyurethane.

FIGS. 3A to 3C are schematic views illustrating the configuration and function of a second embodiment of the present invention, which concerns the polishing pad 9. The polishing pad 9 in this embodiment is entirely made of a shape memory material, that is, the polishing fiber 11 itself is made of a shape memory alloy. The other configuration and function of this embodiment are the same as those in the first embodiment described with reference to FIGS. 2A to 2C. Even in this embodiment, the "fatigue state" of the polishing fibers 11 made of the shape memory alloy is recovered only by returning the polishing pad 9 to the original environmental condition.

The polishing process using such a polishing pad will be described below.

Figure 4A:
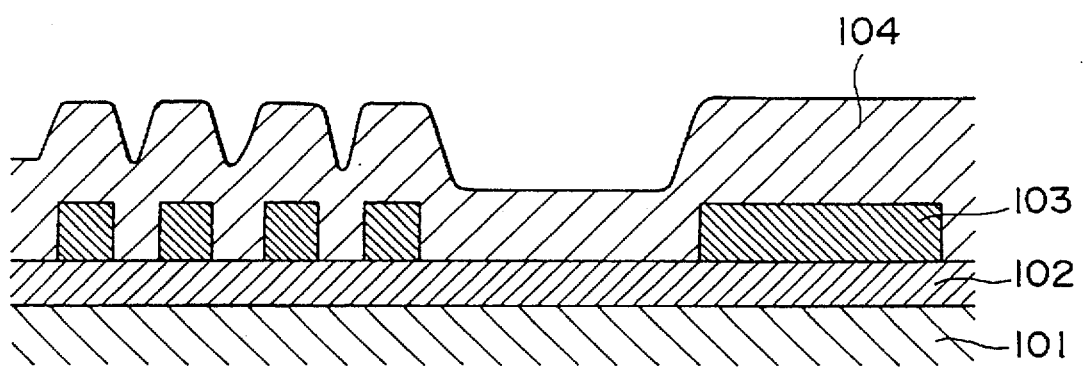
FIGS. 4A and 4B are schematic views showing a third embodiment concerning a polishing process carried out using the apparatus shown in FIGS. 3A to 3C, and a fifth embodiment concerning a polishing process carried out using the apparatus shown in FIGS. 2A to 2C.

A third embodiment of the present invention will be described with reference to FIGS. 4A and 4B, in which an insulating film between Al interconnection layers is planarized using the above CMP apparatus. As shown in FIG. 4A, a first interlayer insulating film 102 made of silicon oxide or the like and an Al interconnecting layer 103 were formed on a semiconducting substrate 101 made of silicon or the like, and a second interlayer insulating film 104 was further formed thereon, to prepare a sample wafer. It is to be noted that all of these films are formed by a known method.

Next, the second interlayer 104 of the sample wafer was subjected to chemical/mechanical polishing using the polishing apparatus shown in FIG. 1 under the following conditions. In addition, the polishing pad shown in FIGS. 2A to 2C was used for this polishing.

rotational speed of polishing plate: 50 rpm rotational speed of carrier: 17 rpm polishing pressure: 8 psi temperature of polishing pad: 30° to 40° C.

flow rate of slurry: 225 ml/min

The above polishing condition is well-known for polishing an insulating film. Here, a slurry which is suspended in a solution of KOH/water/alcohol is used for carrying out polishing in a basic atmosphere.

Figure 4B:
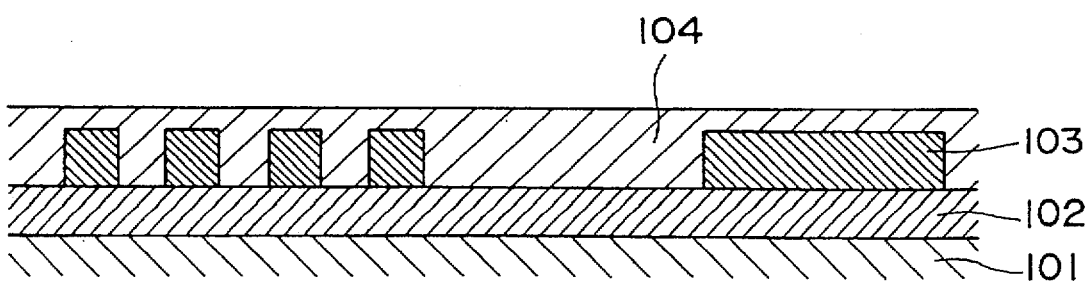

The planarization shown in FIG. 4B was thus obtained. As seen from FIG. 4B, the polishing process in this embodiment improved the total throughput per week by 30% as compared with the polishing process using the related art apparatus. This is because a time required for resetting the polishing pad is largely reduced.

Figure 5A:
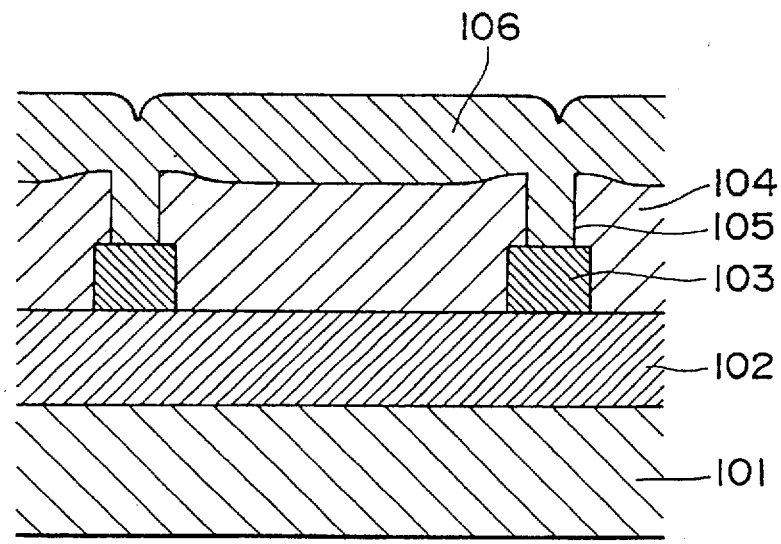
FIGS. 5A and 5B are schematic views showing a fourth embodiment concerning a polishing process carried out using the apparatus shown in FIGS. 3A to 3C.

A fourth embodiment of present invention will be described with reference to FIGS. 5A to 5B, in which a blanket tungsten buried upon formation of an Al interconnection layer is planarized. As shown in FIG. 5A, a first interlayer insulating film 102 made of silicon oxide or the like and an Al interconnection layer 103 were formed on a semiconducting substrate 101 made of silicon or the like and a second interlayer insulating film 104 was further formed therein; and openings 105 were formed, and were buried with a blanket tungsten 106, to form a sample wafer. It is to be noted that all of these films are formed by a known method.

Next, the second interlayer 104 of the sample wafer was subjected to chemical/mechanical polishing using the polishing apparatus shown in FIG. 1 under the following conditions. In addition, the polishing pad shown in FIGS. 3A to 3C was used for this polishing.

rotational speed of polishing plate: 50 rpm rotational speed of carrier: 17 rpm polishing pressure: 10 psi temperature of polishing pad: 30° to 40° C.

flow rate of slurry: 225 ml/min

The above polishing condition is well-known for polishing an insulating film. Here, a slurry which is suspended in a solution of diluted hydrofluoric acid/water/alcohol is used for carrying out polishing in an acidic atmosphere.

Figure 5B:
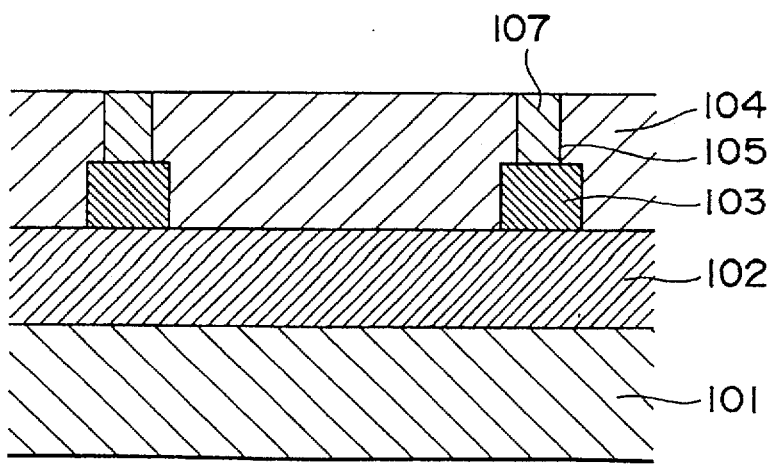

The planarization shown in FIG. 5B was thus obtained. As seen from FIG. 5B, the polishing process in this embodiment improved the total throughput per week by 30% as compared with the polishing process using the related art apparatus. This is because a time required for resetting the polishing pad is largely reduced.

A fifth embodiment will be described, in which an insulating film between Al interconnection layers is planarized using the above CMP apparatus similarly to the third embodiment. As shown in FIG. 4A, a first interlayer insulating film 102 made of silicon oxide or the like and an Al interconnection layer 103 were formed on a semiconducting substrate 101 made of silicon or the like and a second interlayer insulating film 104 was further formed thereon.

Next, the second interlayer insulating film 104 was subjected to chemical/mechanical polishing using the polishing apparatus shown in FIG. 1 under the following conditions. In this embodiment, the polishing pad using a shape memory alloy filament as the core of a polishing fiber as shown in FIGS. 2A to 2C was used in this embodiment, differently from the third and fourth embodiments.

rotational speed of polishing plate: 50 rpm rotational speed of carrier: 17 rpm polishing pressure: 8 psi temperature of polishing pad: 30° to 40° C.

flow rate of slurry: 225 ml/min

The above polishing condition is well-known for polishing an insulating film. Here, a slurry which is suspended in a solution of KOH/water/alcohol is used for carrying out polishing in a basic atmosphere.

The planarization shown in FIG. 4B was thus obtained. The polishing process in this embodiment improved the total throughput per week by 40% as compared with the polishing process using the related art apparatus. This is because a time required for resetting the polishing pad is largely reduced.

According to the chemical/mechanical polishing of the present invention, polishing is performed using a polishing pad made of a shape memory material as described above, so that the necessity of a resetting work for recovering the "fatigue state" of the polishing pad is eliminated and polishing fibers of the polishing pad are returned to an upright state only by returning the polishing pad to the original environmental condition, thus making it possible to simplify a polishing process and to increase the productivity, resulting in the enhanced total throughput. This is effective to improve the productivity of semiconductor devices such as LSIs by performing chemical/mechanical polishing for the semiconductor devices at a high reliability.

While the preferred embodiments of the present invention have been described, such description is for illustrative purposes only, and it is to be understood that changes in design may be made without departing from the spirit or scope of the following claims.

What is claimed is:

1. A method for chemical/mechanical polishing comprising the steps of:

supplying a slurry to an object to be polished;

pressing a polishing pad on said object; and rotating said polishing pad relative to said object;

wherein said polishing pad contains structures made of a shape memory material wherein the structures have an upright state relative to said polishing pad before being used for polishing and a fatigue state after being used for polishing, wherein upon cessation of polishing, said structures made of a shape memory material return to said upright state.

2. A method of chemical/mechanical polishing according to claim 1, wherein said shape memory material is a shape memory alloy.

3. A method of chemical/mechanical polishing according to claim 1 wherein said shape memory material comprises a core of each of a plurality of polishing fibers of said polishing pad.

4. A method of chemical/mechanical polishing according to claim 3 wherein said shape memory material is made of a shape memory alloy filament coated with a resin.

5. A method of chemical/mechanical polishing according to claim 4 wherein the diameter of the shape memory alloy filament is in a range of 0.1 µm or less.

6. A method of chemical/mechanical polishing according to claim 1 wherein said polishing pad is itself is made up of a shape memory alloy.

7. An apparatus for chemical/mechanical polishing comprising:

a polishing pad structurally arranged in said apparatus to be pressed to an object to be polished and rotated relative to said object for polishing said object; and means for supplying a slurry to said object when said object is polished by said polishing pad;

wherein said polishing pad contains a plurality of polishing fibers made of a shape memory material wherein the polishing fibers have an upright state relative to said polishing pad before being used for polishing and a fatigue state after being used for polishing, wherein upon cessation of polishing, said polishing fibers of said shape memory material return to said upright state.

8. An apparatus for chemical/mechanical polishing according to claim 7, wherein said polishing fibers are set to be approximately upright to said polishing surface.

9. An apparatus for chemical/mechanical polishing according to claim 7, wherein each of said polishing fibers is formed of a core coated with a coating material.

10. An apparatus for chemical/mechanical polishing according to claim 7, wherein said core of each of said polishing fibers of said polishing pad is a filament made of a shape memory alloy.

11. An apparatus for chemical/mechanical polishing according to claim 7, wherein said coating material of said polishing fibers of said polishing pad is a resin.

12. An apparatus for chemical/mechanical polishing according to claim 9, wherein the diameter of said core of each of said polishing fibers is in a range of 0.1 µm or less.

13. An apparatus for chemical/mechanical polishing according to claim 7, said coating material is polyurethane.

14. An apparatus for chemical/mechanical polishing according to claim 7, wherein said core of said polishing fiber of said polishing pad is a filament made of a shape memory alloy.

15. An apparatus for chemical/mechanical polishing according to claim 14, wherein said coating material of said polishing fiber of said polishing pad is a resin.

16. An apparatus for chemical/mechanical polishing according to claim 14, wherein the diameter of said core of said polishing fiber is in a range of 0.1 μm or less.

17. An apparatus for chemical/mechanical polishing according to claim 15, said coating material is polyurethane.

18. An apparatus for chemical/mechanical polishing comprising:

means for pressing a polishing pad to an object to be polished;

means for rotating said polishing pad relative to said object for polishing said object; and means for supplying a slurry to said object when said object is being polished by said polishing pad;

wherein said polishing pad contains structures made of a shape memory material wherein the structures have an upright state relative to said polishing pad before being used for polishing and a fatigue state after being used for polishing, wherein upon cessation of polishing, said structures of said shape memory material return to said upright state.

* * * * *